United States Patent
Zhang et al.

(10) Patent No.: US 10,355,634 B1
(45) Date of Patent: Jul. 16, 2019

(54) ISOLATION OF PARTICULAR FAULT CONDITIONS IN AN ELECTRIC MACHINE ASSEMBLY

(71) Applicant: GM Global Technology Operations LLC, Detroit, MI (US)

(72) Inventors: Jiyu Zhang, Sterling Heights, MI (US); Mutasim A. Salman, Rochester Hills, MI (US)

(73) Assignee: GM Global Technology Operations LLC, Detroit, MI (US)

(*) Notice: Subject to any disclaimer, the term of this patent is extended or adjusted under 35 U.S.C. 154(b) by 0 days.

(21) Appl. No.: 16/005,775

(22) Filed: Jun. 12, 2018

(51) Int. Cl.
| | |
|---|---|
| *H02P 7/00* | (2016.01) |
| *H02P 29/024* | (2016.01) |
| *H02P 21/14* | (2016.01) |
| *G01R 31/34* | (2006.01) |
| *G01R 31/02* | (2006.01) |
| *B60W 10/08* | (2006.01) |

(52) U.S. Cl.
CPC .......... *H02P 29/024* (2013.01); *B60W 10/08* (2013.01); *G01R 31/024* (2013.01); *G01R 31/346* (2013.01); *H02P 21/14* (2013.01); *B60W 2710/083* (2013.01)

(58) Field of Classification Search
CPC ....... H02P 29/024; H02P 21/14; B60W 10/08; B60W 2710/083; G01R 31/024; G01R 31/346
USPC ....................................................... 318/490
See application file for complete search history.

(56) References Cited

U.S. PATENT DOCUMENTS

| | | |
|---|---|---|
| 2004/0134267 A1 | 7/2004 | Boesch et al. |
| 2010/0295491 A1 | 11/2010 | Schulz et al. |
| 2013/0033215 A1 | 2/2013 | Krishnamurthy et al. |

OTHER PUBLICATIONS

Gilbert Hock Beng Foo, Xinan Zhang, D. M. Vilathgamuwa, "A Sensor Fault Detection and Isolation Method in Interior Permanent-Magnet Synchronous Motor Drives Based on an Extended Kalman Filter", IEEE Transactions on Industrial Electronics, Aug. 2013, p. 3485-3495, vol. 60.

*Primary Examiner* — Eduardo Colon Santana
*Assistant Examiner* — Gabriel Agared
(74) *Attorney, Agent, or Firm* — Quinn IP Law

(57) ABSTRACT

An electric machine assembly having an electric machine and a controller-based method for isolating a particular fault condition in the electric machine. A plurality of current sensors is configured to output respective measured currents in respective phases of the electric machine. A position sensor is configured to output a rotor position of the electric machine. A controller is configured to group the respective measured currents into respective combinations of two. The controller is configured to calculate respective residual factors ($R_i$), and a global residual factor (G) based on the respective residual factors ($R_i$). Responsive to at least three of the global residual factor (G) and the respective residual factors ($R_i$) exceeding respective calibrated error thresholds, the controller is configured to identify a particular fault condition from among a plurality of possible fault conditions and execute a control action with respect to the electric machine.

17 Claims, 2 Drawing Sheets

ISOLATION OF PARTICULAR FAULT CONDITIONS IN AN ELECTRIC MACHINE ASSEMBLY

INTRODUCTION

The disclosure relates generally to control of an electric machine assembly, and more particularly, to isolation of particular fault conditions in the electric machine assembly. An electric machine, such as an interior permanent magnet machine, includes a rotor having a plurality of permanent magnets of alternating polarity. The rotor is rotatable within a stator which generally includes multiple stator windings and magnetic poles of alternating polarity. An electric machine may function as a motor converting electrical energy to kinetic energy and/or a generator converting kinetic energy to electrical energy. Electric machines are employed in a wide array of systems, such as automobiles, planes, trains, medical devices, and construction equipment.

SUMMARY

Disclosed herein is an electric machine assembly and a controller-based method of isolating a particular fault condition from a plurality of fault conditions in the electric machine assembly. The electric machine assembly includes an electric machine having a rotor and a stator. A plurality of current sensors is in communication with the electric machine and configured to output respective measured currents in respective phases of the electric machine. A position sensor is configured to output a rotor position of the electric machine. The controller is in communication with the electric machine and has a processor and tangible, non-transitory memory on which is recorded instructions for executing the method.

Execution of the instructions by the processor causes the controller to group the respective measured currents into respective combinations of two such that each of the respective measured currents is in a respective pair with another of the respective measured currents. The controller is configured to calculate respective residual factors ($R_i$) for the respective combinations based in part on the rotor position and the respective measured currents. The controller is configured to calculate a global residual factor (G) based on the respective residual factors ($R_i$). Responsive to at least three of the global residual factor (G) and the respective residual factors ($R_i$) exceeding respective calibrated error thresholds, the controller is configured to identify a particular fault condition from among a plurality of fault conditions. By way of example, degradation of insulation between windings in an electric machine may cause a short circuit of both turn to turn and inter turn windings. Corroded or loose electrical connections may increase the internal resistance of an electrical circuit, such as in a current measuring device, which reduces the electrical current flowing through the circuit. The controller is configured to execute a control action with respect to the electric machine, including recording a diagnostic code indicative of the particular fault condition.

Identifying the particular fault condition from among the plurality of possible fault conditions includes diagnosing a motor fault condition when: (1) the first residual factor ($R_1$), the second residual factor ($R_2$), the third residual factor ($R_3$) and the global residual factor (G) are above the respective calibrated error thresholds; and (2) the first parameter ($P_0$) is less than a predetermined parameter threshold ($H_0$). A first current sensor fault condition is diagnosed when the global residual factor (G), the first residual factor ($R_1$) and the third residual factor ($R_3$) are above the respective calibrated error thresholds. A second current sensor fault condition is diagnosed when the global residual factor (G), the first residual factor ($R_1$) and the second residual factor ($R_2$) are above the respective calibrated error thresholds. A third current sensor fault condition is diagnosed when the global residual factor (G), the second residual factor ($R_2$) and the third residual factor ($R_3$) are above the respective calibrated error thresholds.

A resolver bias fault condition is diagnosed when the first residual factor ($R_1$), the second residual factor ($R_2$), the third residual factor ($R_3$) are above the respective calibrated error thresholds and the first parameter ($P_0$) is less than a predetermined parameter threshold ($H_0$). A resolver non-bias fault condition is diagnosed when the first residual factor ($R_1$), the second residual factor ($R_2$), the third residual factor ($R_3$) and the first parameter ($P_0$) is at or above a predetermined parameter threshold ($H_0$).

Calculating the respective residual factors ($R_i$) for the respective combinations may include calculating a respective estimated voltage ($V_i$) for the respective combinations based in part on the rotor position and the respective measured currents, and obtaining the respective residual factors ($R_i$) by subtracting the respective estimated voltage ($V_i$) from a desired voltage ($v^*$). In one example, the respective residual factors include a first residual factor ($R_1$), a second residual factor ($R_2$) and a third residual factor ($R_3$), and the respective measured currents include a first measured current ($i_A$), a second measured current ($i_B$) and a third measured current ($i_C$) (measuring the first phase, second phase and third phase, respectively). The global residual factor (G) may be defined as a square root of $((R_1-R_2)^2+(R_2-R_3)^2+(R_1-R_3)^2)$.

Obtaining the first residual factor ($R_1$) may include obtaining a first estimated current in a dq reference frame based on the rotor position, the first measured current ($i_A$) and the second measured current ($i_B$). A first estimated voltage is obtained in the dq reference frame based in part on the first estimated current. The first residual factor ($R_1$) is calculated as an absolute value of a difference between a desired voltage ($v^*$) and the first estimated voltage. Obtaining the second residual factor ($R_2$) may include obtaining a second estimated current in a dq reference frame based on the rotor position, the second measured current ($i_B$) and the third measured current ($i_C$). A second estimated voltage is obtained in the dq reference frame based in part on the second estimated current. The second residual factor ($R_2$) is calculated as an absolute value of a difference between a desired voltage ($v^*$) and the second estimated voltage.

Obtaining the third residual factor ($R_3$) may include obtaining a third estimated current in a dq reference frame based on the rotor position, the third measured current ($i_C$) and the first measured current ($i_A$). A third estimated voltage is obtained in the dq reference frame based in part on the third estimated current. The third residual factor ($R_3$) is calculated as an absolute value of a difference between a desired voltage ($v^*$) and the third estimated voltage. The controller may be configured to obtain a first parameter ($P_0$) based on a plurality of input factors. In one example, the first parameter ($P_0$) is based on a rate of change in time (t) of the rotor position ($\theta$), a number of pole pairs ($\rho$) in the electric machine, a gearbox ratio ($\eta$) of a transmission operatively connected to the electric machine, and a wheel speed measurement ($\omega$) of at least one wheel operatively connected to the electric machine. The first parameter ($P_0$) may be calculated as an absolute value of $$\left(\frac{d\theta}{dt} - \rho\eta\omega\right).$$

The above features and advantages and other features and advantages of the present disclosure are readily apparent from the following detailed description of the best modes for carrying out the disclosure when taken in connection with the accompanying drawings.

DETAILED DESCRIPTION

Figure 1:
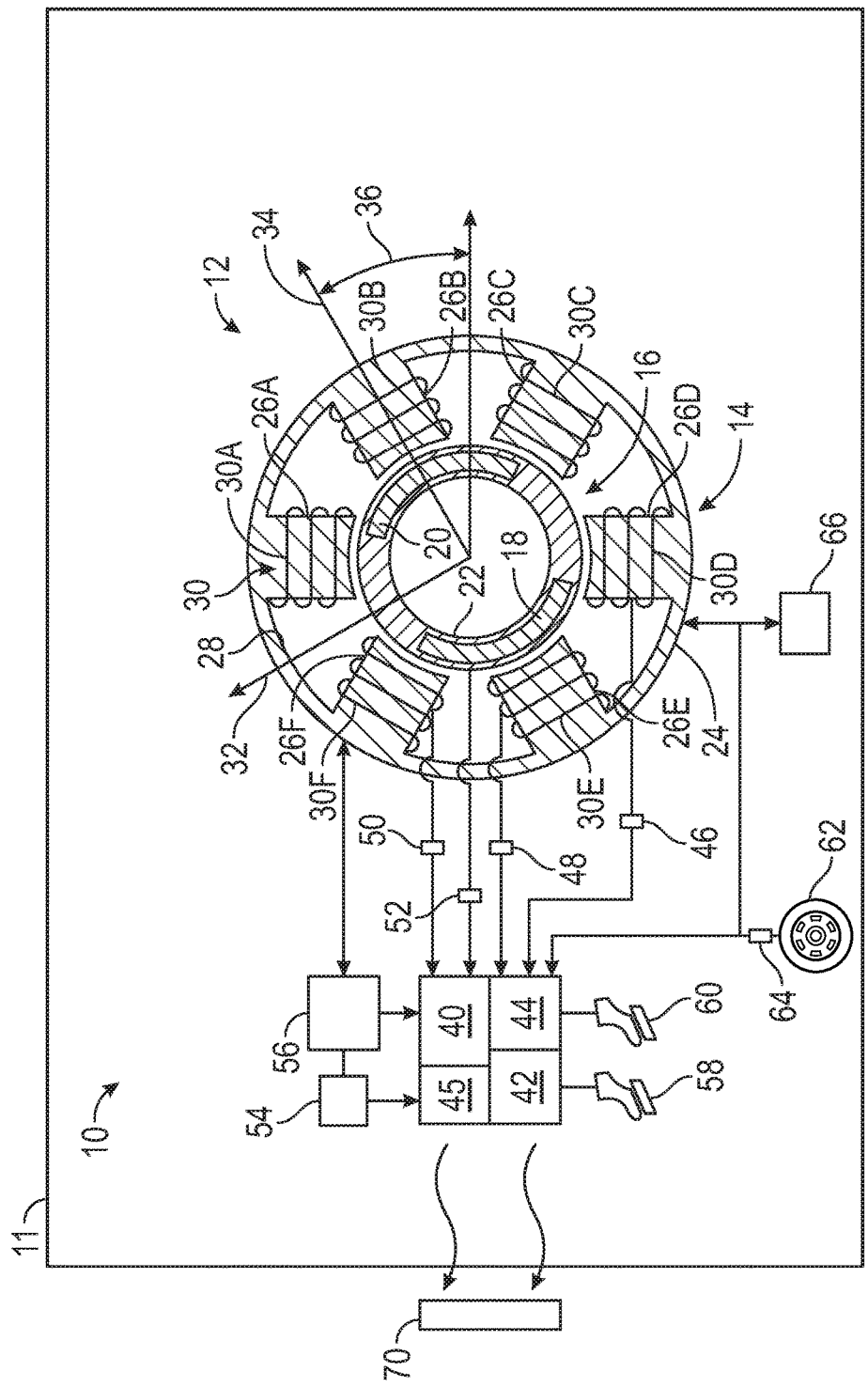
FIG. 1 is a schematic fragmentary partly sectional view of an electric machine assembly having an electric machine and a controller.

Referring to the drawings, wherein like reference numbers refer to like components, FIG. 1 schematically illustrates an electric machine assembly 10 having an electric machine 12. The assembly 10 may be a component of a device 11. The device 11 may be a mobile platform, such as, but not limited to, a passenger car, sport utility vehicle, light truck, heavy duty vehicle, ATV, minivan, bus, transit vehicle, bicycle, robot, farm implement, sports-related equipment, boat, plane and train. The device 11 may be a non-mobile platform, such as a medical device or construction equipment. The device 11 may take many different forms and include multiple and/or alternate components and facilities.

Referring to FIG. 1, the electric machine 12 includes a stator 14 and a rotor 16. The electric machine 12 may include, but is not limited to, induction machines, synchronous machines, permanent magnet machines and bar wound machines. In the example shown in FIG. 1, the rotor 16 includes a first permanent magnet 18 and a second permanent magnet 20 of alternating polarity around the outer periphery of a rotor core 22. The rotor 16 may include as many permanent magnets as required per the application; for simplicity two are shown. The rotor 16 is rotatable at a rotor speed within the stator 14. While the embodiment shown in FIG. 1 illustrates a three-phase, single pole-pair (i.e. two poles) machine, it is understood that the number of phases or pole pairs may be varied.

Referring to FIG. 1, the stator 14 includes a stator core 24 which may be cylindrically shaped with a hollow interior. The stator core 24 may include a plurality of inwardly-protruding stator teeth 26A-F, separated by gaps or slots 28. In the embodiment shown in FIG. 1, stator windings 30 may be operatively connected to the stator core 24, such as for example, being coiled around the stator teeth 26A-F. The stator 14 is configured to have electric current flowing in the stator windings 30 and causing a rotating magnetic field in the stator 14.

Referring to FIG. 1, the stator windings 30 may include three sets of windings; one set for each of three phases (the first phase through stator windings 30A and 30D, the second phase through stator windings 30B and 30E and the third phase through stator windings 30C and 30F). Alternatively, slip rings or brushes (not shown) may be employed. Referring to FIG. 1, a quadrature (q) magnetic axis 32 and a direct (d) magnetic axis 34 are shown. The first and second permanent magnets 18, 20 create a magnetic field and magnetic flux. Referring to FIG. 1, the magnetic flux lines of the first and second permanent magnets 18, 20 are aligned when a rotor angle 36 is zero. While an example electric machine 12 is shown, the components illustrated in the FIGS. are not intended to be limiting. Indeed, additional or alternative components and/or implementations may be used.

Referring to FIG. 1, the assembly 10 includes a controller 40 in communication (e.g. electronic communication) with the electric machine 12. Referring to FIG. 1, the controller 40 includes at least one processor 42 and at least one memory 44 (or non-transitory, tangible computer readable storage medium) on which instructions are recorded for executing method 100, shown in FIG. 2. The memory 44 can store controller-executable instruction sets, and the processor 42 can execute the controller-executable instruction sets stored in the memory 44. As described below, the method 100 detects and isolates considered faults using a model-based approach. This approach uses multiple residual factors such that each residual factor has a unique fault signature, so as to detect and isolate the considered faults.

The controller 40 of FIG. 1 is specifically programmed to execute the blocks of the method 100 (as discussed in detail below with respect to FIG. 2) and can receive inputs from various sensors. Referring to FIG. 1, the assembly 10 may include a first current sensor 46, a second current sensor 48, a third current sensor 50, each capable of measuring an electrical current of the first phase, second phase and third phase, respectively, and sending a respective signal to the controller 40. The assembly 10 may include a resolver 52 that measures the position of the rotor 16 and generates a position signal. Additionally, controller 40 may be programmed to determine other physical factors by modeling or other estimation technique available to those skilled in the art. Referring to FIG. 1, a battery pack 54 may be operatively connected to the electric machine 12 as a source of DC link voltage. A pulse width modulated (PWM) inverter 56 may be operatively connected to the controller 40 and battery pack 54, and configured to convert DC to AC current.

The controller 40 is programmed or configured to receive a torque command (T). The torque command (T) may be received by the controller 40 in response to an operator input or an automatically-fed input condition monitored by the controller 40. If the device 11 is a vehicle, the controller 40 may determine the torque command (T) based on input signals from an operator through an accelerator pedal 58 and brake pedal 60, shown in FIG. 1. Referring to FIG. 1, the controller 40 may be operatively connected to or in communication with at least one wheel 62, a wheel speed sensor 64 and a transmission 66 characterized by a gearbox ratio ($\eta$).

Figure 2:
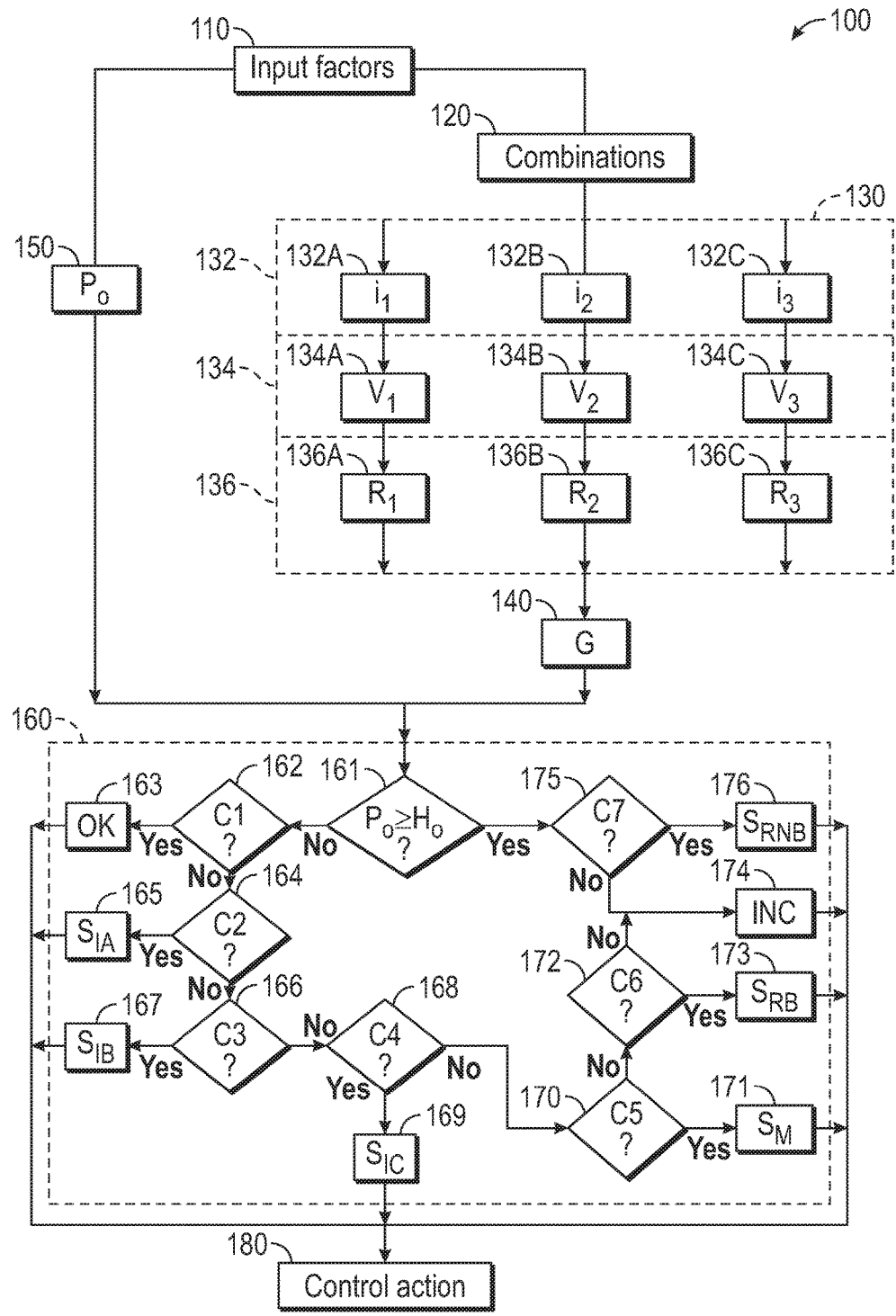
FIG. 2 is a flowchart for a method executable by the controller of FIG. 1 for isolating particular fault conditions in the electric machine assembly.

Referring now to FIG. 2, a flowchart of the method 100 stored on and executable by the controller 40 of FIG. 1 is shown. Method 100 need not be applied in the specific order recited herein. Furthermore, it is to be understood that some blocks may be eliminated. In block 110 of FIG. 2, the controller 40 is configured to obtain a plurality of input factors including the torque command (T), the rotor position ($\theta$) and the number of pole pairs ($\rho$) in the electric machine 12. Referring to FIG. 1, the controller 40 may be configured to obtain a wheel speed measurement ($\omega$) of the at least one wheel 62, which may be based on the wheel speed sensor 64. Also in block 110, the controller 40 is configured to determine a desired voltage (v*) based at least partially on the torque command (T). The desired voltage (v*) is characteristic of a particular machine since the torque produced by an electric machine 12 is a function of the current flowing through the windings, which is generated as a result of a voltage being applied. The desired voltage (v*) may be obtained from a look-up table or data repository based on the characteristics of the electric machine 12 at hand.

In block 120 of FIG. 2, the controller 40 is configured to group the respective measured currents into respective combinations of two such that each of the respective measured currents is in a respective pair with another of the respective measured currents. In the example illustrated, the respective measured currents include a first measured current ($i_A$), a second measured current ($i_B$) and a third measured current ($i_C$), measuring the first phase, second phase and third phase, respectively. They are grouped into the following three combinations:

($i_A$ and $i_B$), ($i_B$ and $i_C$), and ($i_A$ and $i_C$).

Alternatively, the respective measured currents may include five phases measured by first through fifth measured currents ($i_A$, $i_B$, $i_C$, $i_D$, $i_E$), respectively. In block 130 of FIG. 2, the controller 40 is configured to calculate respective residual factors ($R_i$) for the respective combinations obtained in block 120. In the example illustrated, the respective residual factors are a first residual factor ($R_1$), a second residual factor ($R_2$) and a third residual factor ($R_3$). Block 130 includes sub-blocks 132, 134 and 136, described below.

Per block 132, an estimated current ($i_n$) in a dq reference frame is obtained for the respective combination, via a transformation matrix between variables in the stationary three phase variables reference frame ($f_{abc}$) and those in the rotor reference frame ($f_{dq}$). The estimated current ($i_n$) is understood to be a vector with components ($i_d$, $i_q$). The transformation matrix is based on the rotor position ($\theta$).

For the first residual factor ($R_1$), per block 132A, a first estimated current ($i_1$) in a dq reference frame is obtained based on the rotor position ($\theta$), the first measured current ($i_A$) and the second measured current ($i_B$), via a transformation matrix M1.

$$i_1 = (i_{d1}, i_{q1}) = M1 * \begin{bmatrix} i_A \\ i_B \end{bmatrix}$$

$$\text{Transformation Matrix } M1 = -\sqrt{2} * \begin{bmatrix} \cos(\theta - 2\pi/3) & \cos\theta \\ \sin(\theta - 2\pi/3) & \sin\theta \end{bmatrix}$$

For the second residual factor ($R_2$), per block 132B, a second estimated current ($i_2$) is obtained in a dq reference frame based on the rotor position ($\theta$), the second measured current ($i_B$) and the third measured current ($i_C$), via a transformation matrix M2.

$$i_2 = (i_{d2}, i_{q2}) = M2 * \begin{bmatrix} i_B \\ i_C \end{bmatrix}$$

$$\text{Transformation Matrix } M2 = -\sqrt{2} * \begin{bmatrix} \cos(\theta + 2\pi/3) & -\cos(\theta - 2\pi/3) \\ \sin(\theta + 2\pi/3) & -\sin(\theta - 2\pi/3) \end{bmatrix}$$

For the third residual factor ($R_3$), per block 132C, a third estimated current ($i_3$) is obtained in a dq reference frame based on the rotor position ($\theta$), the third measured current ($i_C$) and the first measured current ($i_A$)), via a transformation matrix M3.

$$i_3 = (i_{d3}, i_{q3}) = M3 * \begin{bmatrix} i_A \\ i_C \end{bmatrix}$$

$$\text{Transformation Matrix } M3 = \sqrt{2} * \begin{bmatrix} \cos(\theta + 2\pi/3) & -\cos\theta \\ \sin(\theta + 2\pi/3) & -\sin\theta \end{bmatrix}$$

Per block 134, a respective estimated voltage ($V_i$) in the dq reference frame is obtained for each combination, via an estimator module 45 which may be embedded in the controller 40. The estimator module 45 employs the estimated current ($i_n$) in the dq reference frame (obtained in block 132). In one example, the estimator module 45 is a sliding mode observer. In another example, the estimator module 45 is an extended Kalman filter. In yet another example, the estimator module 45 is a Luenberger Observer. Additionally, the estimator module 45 may employ parity equations to obtain the respective estimated voltage ($V_i$). The estimator module 45 may be configured or set up with the following relationships:

$$\frac{d\hat{i}_q}{dt} = \frac{1}{L_q}(\eta_q - R_s \hat{i}_q - L_d p \omega_m i_d - \lambda_m p \omega_m)$$

$$\frac{d\hat{i}_d}{dt} = \frac{1}{L_d}(\eta_d - R_s \hat{i}_d + L_q p \omega_m \hat{i}_q)$$

Here, $i_q$, $i_d$ are the true q and d axis currents, while $\hat{i}_q$ and $\hat{i}_d$ are estimated q and d axis currents. Furthermore, $R_s$ is the stator resistance, $L_q$, $L_d$ are the q and d axis inductances, $\lambda_m$ is the magnetic flux developed by the rotor magnets (such as the first and second permanent magnets 18, 20), p is the number of pole pairs, and $\omega_m$ is the mechanical speed of the electric machine 12. The parameters ($\eta_q$, $\eta_d$) are based on pre-selected gain factors $K_1$ and $K_2$.

$$\eta_q = K_1 \text{ sign}(i_q - \hat{i}_q), \eta_d = K_2 \text{ sign}(i_d - \hat{i}_d)$$

The estimated q and d axis currents will converge to the true q and d axis currents if the gain factors $K_1$ and $K_2$ are chosen to be sufficiently large. The operator "sign" has a value of positive one if the value in the bracket is greater than zero, and a value of negative one if the value in the bracket is less than zero. The average of parameters ($\eta_q$, $\eta_d$) will converge to the actual values of the q and d axis voltages ($V_q$, $V_d$), i.e., the respective estimated voltage ($V_i$). The respective estimated voltage ($V_i$) may then be extracted by applying a first order filter, having a time constant $\tau$, as shown below:

$$\eta_q = \left(\tau * \frac{dV_q}{dt} + V_q\right) \text{ and } \eta_d = \left(\tau * \frac{dV_d}{dt} + V_d\right)$$

Per blocks 134A, 134B and 134C, the first estimated voltage ($V_1$), the second estimated voltage ($V_2$) and the third estimated voltage ($V_3$) in the dq reference frame may be obtained from the first estimated current ($i_1$), second estimated current ($i_2$), and third estimated current ($i_3$), respectively, via the estimator module 45 discussed above. The first estimated current ($i_1$), second estimated current ($i_2$), and third estimated current ($i_3$) each represent a vector current measurement in a dq reference frame, i.e., $i_1 = (i_{d1}, i_{q1})$, $i_2 = (i_{d2}, i_{q2})$ and $i_3 = (i_{d3}, i_{q3})$.

Per block 136, the respective residual factors ($R_i$) are obtained by subtracting the respective estimated voltage ($V_i$) (obtained in block 134) from the desired voltage (v*) (obtained in block 110 and based at least partially on the torque command (T)). The first residual factor ($R_1$) is calculated in block 136A as an absolute value of the difference between the desired voltage ($v^*$) and the first estimated voltage ($V_1$). The second residual factor ($R_2$) is calculated in block 136B as an absolute value of a difference between the desired voltage ($v^*$) and the second estimated voltage ($V_2$). The third residual factor ($R_3$) is calculated in block 136C, as an absolute value of a difference between the desired voltage ($v^*$) and the third estimated voltage ($V_3$).

In block 140 of FIG. 2, the controller 40 is configured to calculate a global residual factor (G) based on the respective residual factors ($R_i$). The global residual factor (G) may be defined as a square root of the squares of the differences between the respective residual factors ($R_i$). In the example shown, the global residual factor (G) is defined as a square root of $((R_1-R_2)^2+(R_2-R_3)^2+(R_1-R_3)^2)$.

In block 150 of FIG. 2, the controller 40 is configured to calculate a first parameter ($P_0$) based on the plurality of input factors obtained in block 110. In one example, the first parameter ($P_0$) is based on a rate of change in time (t) of the rotor position ($\theta$), a number of pole pairs ($\rho$) in the electric machine 12, the gearbox ratio ($\eta$), and the wheel speed measurement ($\omega$) and may be calculated as an absolute value of $$\left(\frac{d\theta}{dt} - \rho\eta\omega\right).$$

In block 160 of FIG. 2, the controller 40 is configured to identify a particular fault condition from among a plurality of possible fault conditions, in response to at least three of the global residual factor (G) and the respective residual factors ($R_i$) exceeding respective calibrated error thresholds. Table 1 below illustrates a plurality of possible fault conditions in the top row and different variables in the extreme left column. A check mark in a row indicates that the corresponding variable has exceeded their respective threshold.

TABLE 1

|       | $S_M$ | $S_{IA}$ | $S_{IB}$ | $S_{IC}$ | $S_{RB}$ | $S_{RNB}$ | OK |
|-------|-------|----------|----------|----------|----------|-----------|----|
| $P_0$ |       |          |          |          |          |           | X  |
| $R_1$ |  X    | X        | X        |          | X        | X         |    |
| $R_2$ |  X    |          | X        | X        | X        | X         |    |
| $R_3$ |  X    | X        |          | X        | X        | X         |    |
| G     |  X    | X        | X        | X        |          |           |    |

As shown in Table 1 above, a motor fault condition ($S_M$) is diagnosed when: (1) the first residual factor ($R_1$), the second residual factor ($R_2$), the third residual factor ($R_3$) and the global residual factor (G) are above their respective calibrated error thresholds; and (2) the first parameter ($P_0$) is less than a predetermined parameter threshold ($H_0$). A first current sensor fault condition ($S_{IA}$) is diagnosed when the global residual factor (G), the first residual factor ($R_1$) and the third residual factor ($R_3$) are above the respective calibrated error thresholds. A second current sensor fault condition ($S_{IB}$) is diagnosed when the global residual factor (G), the first residual factor ($R_1$) and the second residual factor ($R_2$) are above the respective calibrated error thresholds. A third current sensor fault condition ($S_{IC}$) is diagnosed when the global residual factor (G), the second residual factor ($R_2$) and the third residual factor ($R_3$) are above the respective calibrated error thresholds.

A resolver bias fault condition ($S_{RB}$) is diagnosed when the first residual factor ($R_1$), the second residual factor ($R_2$), the third residual factor ($R_3$) are above the respective calibrated error thresholds and the first parameter ($P_0$) is less than the predetermined parameter threshold ($H_0$). A resolver non-bias fault condition ($S_{RB}$) is diagnosed when the first residual factor ($R_1$), the second residual factor ($R_2$), the third residual factor ($R_3$) are above the respective calibrated error thresholds and the first parameter ($P_0$) is at or above a predetermined parameter threshold ($H_0$). A condition or status of "OK" or healthy is determined when none of the first residual factor ($R_1$), the second residual factor ($R_2$), the third residual factor ($R_3$) has exceeded their respective calibrated error threshold and the first parameter ($P_0$) is less than the predetermined parameter threshold ($H_0$).

Referring now to FIG. 2, a non-limiting example sequence for diagnosing the particular fault condition is shown in block 160. It is to be understood that the logical set-up in the controller 40 may be varied. The example sequence in block 160 relates to a set of conditions C1, C2, C3, C4, C5, C6 and C7, which are listed below:
C1: $R_1<H_1$ and $R_2<H_2$ and $R_3<H_3$ and $G<H_4$
C2: $R_1>H_1$ and $R_2<H_2$ and $R_3>H_3$ and $G>H_4$
C3: $R_1>H_1$ and $R_2>H_2$ and $R_3<H_3$ and $G>H_4$
C4: $R_1<H_1$ and $R_2>H_2$ and $R_3>H_3$ and $G>H_4$
C5: $R_1>H_1$ and $R_2>H_2$ and $R_3>H_3$ and $G>H_4$
C6: $R_1>H_1$ and $R_2>H_2$ and $R_3>H_3$ and $G<H_4$
C7 (same as C6): $R_1>H_1$ and $R_2>H_2$ and $R_3>H_3$ and $G<H_4$
The set of conditions C1, C2, C3, C4, C5, C6 and C7 involve a determination of whether the first residual factor ($R_1$), the second residual factor ($R_2$), the third residual factor ($R_3$) and the global residual factor (G) are at and above or below their respective calibrated error thresholds, identified above as ($H_1$, $H_2$, $H_3$, $H_4$).

In block 161 of FIG. 2, the controller 40 is configured to determine if the first parameter ($P_0$) is greater than or equal to a predetermined parameter threshold ($H_0$). If not, the method 100 proceeds to block 162, where it is determined if the set of conditions C1 is true. If the set of conditions C1 is true, in block 163, a status of "OK" or healthy is determined (and encoded per block 180, described below). If the set of conditions C1 is not true, the method 100 proceeds to block 164 to determine if the set of conditions C2 is true. If so, in block 165, a first current sensor fault condition ($S_{IA}$) is diagnosed. If not, the method 100 proceeds to block 166 to determine if the set of conditions C3 is true. If the set of conditions C3 is true, a second current sensor fault condition ($S_{IB}$) is diagnosed in block 167. If not, the method 100 proceeds to block 168 to determine if the set of conditions C4 is true. If the set of conditions C4 is true, a third current sensor fault condition ($S_{IC}$) is diagnosed in block 169. If not, the method 100 proceeds to block 170 to determine if the set of conditions C5 is true. If the set of conditions C5 is true, a motor fault condition ($S_M$) is diagnosed in block 171. If not, the method 100 proceeds to block 172 to determine if the set of conditions C6 is true. If the set of conditions C6 is true, a resolver bias fault condition ($S_{RB}$) is diagnosed in block 173. If not, an "Inconclusive" diagnosis code ("INC" in FIG. 2) is diagnosed in block 174.

In block 161, the controller 40 was configured to determine if the first parameter ($P_0$) is greater than or equal to the predetermined parameter threshold ($H_0$). If this is true, the method 100 proceeds to block 175 to determine if the set of conditions C7 is true. If the set of conditions C7 is true, a resolver non-bias fault condition ($S_{RNB}$) is diagnosed in block 176. If not, an "Inconclusive" code ("INC" in FIG. 2) is diagnosed in block 174.

In block 180 of FIG. 2, the controller 40 is configured to execute a control action with respect to the electric machine 12, including recording a diagnostic code indicative of the particular fault condition diagnosed. The diagnostic code, which may be part of a diagnostic report, may be wirelessly sent to a remote device, such as remote server 70 in FIG. 1, through a WIFI connection. Other methods may be employed, including but not limited to, a wired service tool that is plugged into the device 11. The method 100 serves a prognosis function such that after a fault condition is determined, an operator is informed about the current state of health of the assembly 10 with specificity. In one example, the device 11 is an autonomous vehicle and the remote server 70 is configured to manage its operation. The controller 40 may be configured to send a message to the remote server 70 that a manual inspection of the device 11 is recommended. The controller 40 may be configured to initiate an alternative mode of operation for the device 11, such as a "limp home mode." Another technical advantage of the method 100 is that because the exact fault location may be isolated, unnecessary repair costs may be avoided, such as replacing a particular sensor instead of replacing the entire motor assembly.

The controller 40 may be programmed to obtain the respective calibrated error thresholds ($H_1$, $H_2$, $H_3$, $H_4$) and the predetermined parameter threshold ($H_0$) via a number of methods available to those skilled in the art. The respective calibrated error thresholds ($H_1$, $H_2$, $H_3$, $H_4$) and the predetermined parameter threshold ($H_0$) may be physical values or percentage deviations from a fixed value and are selected based on the application at hand. For example, the predetermined parameter threshold ($H_0$) may be obtained via design-of-experiment (DOE), statistical or optimization methods or a model-based calibration process. The respective calibrated error thresholds ($H_1$, $H_2$, $H_3$, $H_4$) values may be obtained via an experimental set-up in a laboratory and stored in a look-up table, data repository or other data storage available to those skilled in the art. By way of non-limiting examples, the predetermined parameter threshold ($H_0$) and the fourth threshold ($H_4$) may be between a range of 0.5% and 1%. The second threshold ($H_2$), the third threshold ($H_3$) and the first threshold ($H_1$) may be between a range of 2% and 5%.

The method 100 (and the controller 40 executing the method 100) improves the functioning of the device 11 by determining a course of action for the assembly 10 and enabling control of a complex system with a minimum amount of error. Thus the method 100 (and the controller 40 executing the method 100) are not mere abstract ideas, but are intrinsically tied to the functioning of the assembly 10 and the physical output of the electric machine 12. To diagnose and isolate such faults from among a plurality of possible fault conditions, the controller 40 may be programmed to execute the method 100 continuously during operation of the electric machine 12 as an open-loop operation. A technical advantage presented by the method 100 (and the controller 40 executing the method 100) is that additional sensors are not required, as sensor data from previously installed sensors for current measurements and position measurements may be employed.

The controller 40 of FIG. 1 may be an integral portion of, or a separate module operatively connected to, other controllers of the device 11. The controller 40 includes a computer-readable medium (also referred to as a processor-readable medium), including a non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which may constitute a main memory. Such instructions may be transmitted by one or more transmission media, including coaxial cables, copper wire and fiber optics, including the wires that comprise a system bus coupled to a processor of a computer. Some forms of computer-readable media include, for example, a floppy disk, a flexible disk, hard disk, magnetic tape, other magnetic media, a CD-ROM, DVD, other optical media, punch cards, paper tape, other physical media with patterns of holes, a RAM, a PROM, an EPROM, a FLASH-EEPROM, other memory chips or cartridges, or other media from which a computer can read.

Look-up tables, databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store may be included within a computing device employing a computer operating system such as one of those mentioned above, and may be accessed via a network in one or more of a variety of manners. A file system may be accessible from a computer operating system, and may include files stored in various formats. An RDBMS may employ the Structured Query Language (SQL) in addition to a language for creating, storing, editing, and executing stored procedures, such as the PL/SQL language mentioned above.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

What is claimed is:

1. An electric machine assembly comprising:
   an electric machine including a rotor and a stator;
   a plurality of current sensors in communication with the electric machine and configured to output respective measured currents in respective phases of the electric machine;
   a position sensor configured to output a rotor position of the electric machine;
   a controller in communication with the electric machine and having a processor and tangible, non-transitory memory on which instructions are recorded for executing a method of isolating a particular fault condition from a plurality of possible fault conditions, execution of the instructions by the processor causing the controller to:
  group the respective measured currents into respective combinations of two such that each of the respective measured currents is in a respective pair with another of the respective measured currents;
  calculate respective residual factors ($R_i$) for the respective combinations based in part on the rotor position and the respective measured currents;
  calculate a global residual factor (G) based on the respective residual factors ($R_i$);
  responsive to at least three of the global residual factor (G) and the respective residual factors ($R_i$) exceeding respective calibrated error thresholds, identify the particular fault condition from among the plurality of possible fault conditions; and
  execute a control action with respect to the electric machine, including recording a diagnostic code indicative of the particular fault condition.

2. The assembly of claim 1, wherein calculating the respective residual factors ($R_i$) for the respective combinations includes:
  calculating a respective estimated voltage ($V_i$) for the respective combinations based in part on the rotor position and the respective measured currents; and
  obtaining the respective residual factors ($R_i$) by subtracting the respective estimated voltage ($V_i$) from a desired voltage (v*).

3. The assembly of claim 1, wherein:
  the respective residual factors include a first residual factor ($R_1$), a second residual factor ($R_2$) and a third residual factor ($R_3$);
  the respective measured currents include a first measured current ($i_A$), a second measured current ($i_B$) and a third measured current ($i_C$);
  the controller is configured to calculate a first parameter ($P_0$) based on a plurality of input factors; and
  wherein the global residual factor (G) is defined as a square root of $((R_1-R_2)^2+(R_2-R_3)^2+(R_1-R_3)^2)$.

4. The assembly of claim 3, wherein identifying the particular fault condition from among the plurality of possible fault conditions includes:
  diagnosing a motor fault condition when:
    the first residual factor ($R_1$), the second residual factor ($R_2$), the third residual factor ($R_3$) and the global residual factor (G) are above the respective calibrated error thresholds; and
    the first parameter ($P_0$) is less than a predetermined parameter threshold ($H_0$).

5. The assembly of claim 3, wherein identifying the particular fault condition from among a plurality of possible fault conditions includes:
  diagnosing a first current sensor fault condition when the global residual factor (G), the first residual factor ($R_1$) and the third residual factor ($R_3$) are above the respective calibrated error thresholds;
  diagnosing a second current sensor fault condition when the global residual factor (G), the first residual factor ($R_1$) and the second residual factor ($R_2$) are above the respective calibrated error thresholds; and
  diagnosing a third current sensor fault condition when the global residual factor (G), the second residual factor ($R_2$) and the third residual factor ($R_3$) are above the respective calibrated error thresholds.

6. The assembly of claim 3, wherein identifying the particular fault condition from among a plurality of possible fault conditions includes:
  diagnosing a resolver bias fault condition when the first residual factor ($R_1$), the second residual factor ($R_2$), the third residual factor ($R_3$) are above the respective calibrated error thresholds and the first parameter ($P_0$) is less than a predetermined parameter threshold ($H_0$); and
  diagnosing a resolver non-bias fault condition when the first residual factor ($R_1$), the second residual factor ($R_2$), the third residual factor ($R_3$) and the first parameter ($P_0$) is at or above the predetermined parameter threshold ($H_0$).

7. The assembly of claim 3, wherein obtaining the first residual factor ($R_1$) includes:
  obtain a first estimated current in a dq reference frame based on the rotor position, the first measured current ($i_A$) and the second measured current ($i_B$);
  obtain a first estimated voltage in the dq reference frame based in part on the first estimated current; and
  calculate the first residual factor ($R_1$) as an absolute value of a difference between a desired voltage and the first estimated voltage.

8. The assembly of claim 3, wherein obtaining the second residual factor ($R_2$) includes:
  obtain a second estimated current in a dq reference frame based on the rotor position, the second measured current ($i_B$) and the third measured current ($i_C$);
  obtain a second estimated voltage in the dq reference frame based in part on the second estimated current; and
  calculate the second residual factor ($R_2$) as an absolute value of a difference between a desired voltage (v*) and the second estimated voltage.

9. The assembly of claim 3, wherein obtaining the third residual factor ($R_3$) includes:
  obtain a third estimated current in a dq reference frame based on the rotor position, the third measured current ($i_C$) and the first measured current ($i_A$);
  obtain a third estimated voltage in the dq reference frame based in part on the third estimated current; and
  calculate the third residual factor ($R_3$) as an absolute value of a difference between a desired voltage and the third estimated voltage.

10. The assembly of claim 3, further comprising:
  a transmission operatively connected to the electric machine and defining a gearbox ratio ($\eta$);
  at least one wheel operatively connected to the electric machine and having a wheel speed measurement ($\omega$); and
  wherein the first parameter ($P_0$) is based on a rate of change in time (t) of the rotor position ($\theta$), a number of pole pairs ($\rho$) in the electric machine, the gearbox ratio ($\eta$) and the wheel speed measurement ($\omega$), the first parameter ($P_0$) being calculated as an absolute value of $$\left(\frac{d\theta}{dt} - \rho\eta\omega\right).$$

11. A method of isolating a particular fault condition from a plurality of possible fault conditions in an electric machine assembly, the assembly having an electric machine with a rotor and a stator, a plurality of current sensors configured to output respective measured currents in respective phases of the electric machine, a position sensor configured to output a rotor position of the electric machine, a controller having a processor and tangible, non-transitory memory on which instructions are recorded, the method comprising:

receiving and grouping the respective measured currents into respective combinations of two such that each of the respective measured currents is in a respective pair with another of the respective measured currents, via the controller;

calculating respective residual factors ($R_i$) for the respective combinations based in part on the rotor position and the respective measured currents, via the controller;

calculating a global residual factor (G) based on the respective residual factors ($R_i$), via the controller;

responsive to at least three of the global residual factor (G) and the respective residual factors ($R_i$) exceeding respective calibrated error thresholds, identifying the particular fault condition from among the plurality of possible fault conditions, via the controller; and executing a control action with respect to the electric machine, including recording a diagnostic code indicative of the particular fault condition.

12. The method of claim 11, wherein calculating the respective residual factors ($R_i$) for the respective combinations includes:

calculating a respective estimated voltage ($V_i$) for the respective combinations based in part on the rotor position and the respective measured currents; and obtaining the respective residual factors ($R_i$) by subtracting the respective estimated voltage ($V_i$) from a desired voltage ($v^*$).

13. The method of claim 11, wherein:

the respective measured currents include a first measured current ($i_A$), a second measured current ($i_B$) and a third measured current ($i_C$);

calculating the respective residual factors includes calculating a first residual factor ($R_1$), a second residual factor ($R_2$) and a third residual factor ($R_3$); and the method further includes calculating a first parameter ($P_0$) based on a plurality of input factors, and calculating the global residual factor (G) as a square root of $((R_1-R_2)^2+(R_2-R_3)^2+(R_1-R_3)^2)$.

14. The method of claim 13, wherein identifying the particular fault condition from among the plurality of possible fault conditions includes:

diagnosing a motor fault condition when:
the first residual factor ($R_1$), the second residual factor ($R_2$), the third residual factor ($R_3$) and the global residual factor (G) are above the respective calibrated error thresholds; and
the first parameter ($P_0$) is less than a predetermined parameter threshold ($H_0$).

15. The method of claim 13, wherein identifying the particular fault condition from among the plurality of possible fault conditions includes:

diagnosing a first current sensor fault condition when the global residual factor (G), the first residual factor ($R_1$) and the third residual factor ($R_3$) are above the respective calibrated error thresholds;

diagnosing a second current sensor fault condition when the global residual factor (G), the first residual factor ($R_1$) and the second residual factor ($R_2$) are above the respective calibrated error thresholds; and diagnosing a third current sensor fault condition when the global residual factor (G), the second residual factor ($R_2$) and the third residual factor ($R_3$) are above the respective calibrated error thresholds.

16. The method of claim 13, wherein identifying the particular fault condition from among the plurality of possible fault conditions includes:

diagnosing a resolver bias fault condition when the first residual factor ($R_1$), the second residual factor ($R_2$), the third residual factor ($R_3$) are above the respective calibrated error thresholds and the first parameter ($P_0$) is less than a predetermined parameter threshold ($H_0$); and diagnosing a resolver non-bias fault condition when the first residual factor ($R_1$), the second residual factor ($R_2$), the third residual factor ($R_3$) and the first parameter ($P_0$) is at or above the predetermined parameter threshold ($H_0$).

17. The method of claim 13, wherein the assembly includes a transmission defining a gearbox ratio ($\eta$) and at least one wheel having a wheel speed measurement ($\omega$), the method further comprising:

calculating the first parameter ($P_0$) based on a rate of change in time (t) of the rotor position ($\theta$), a number of pole pairs ($\rho$) in the electric machine, the gearbox ratio ($\eta$) and the wheel speed measurement ($\omega$), the first parameter ($P_0$) being calculated as an absolute value of $$\left(\frac{d\theta}{dt} - \rho\eta\omega\right).$$

* * * * *